United States Patent
Giust et al.

(10) Patent No.: US 6,770,947 B2
(45) Date of Patent: Aug. 3, 2004

(54) LASER-BREAKABLE FUSE LINK WITH ALIGNMENT AND BREAK POINT PROMOTION STRUCTURES

(75) Inventors: Gary K. Giust, Cupertino, CA (US); Ruggero Castagnetti, Menlo Park, CA (US); Yauh-Ching Liu, Sunnyvale, CA (US); Shiva Ramesh, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/365,240

(22) Filed: Feb. 12, 2003

(65) Prior Publication Data

US 2003/0155629 A1 Aug. 21, 2003

Related U.S. Application Data

(62) Division of application No. 09/723,476, filed on Nov. 27, 2000, now Pat. No. 6,566,730.

(51) Int. Cl.⁷ ............................................. H01L 27/02
(52) U.S. Cl. ..................... 257/529; 257/209; 257/530; 257/574
(58) Field of Search .............................. 257/209, 529, 257/530, 574, 208, 665

(56) References Cited

U.S. PATENT DOCUMENTS

| | | | | |
|---|---|---|---|---|
| 4,984,054 A | * | 1/1991 | Yamada et al. | 257/529 |
| 5,321,300 A | * | 6/1994 | Usuda et al. | 257/529 |
| 5,608,257 A | * | 3/1997 | Lee et al. | 257/529 |
| 5,622,892 A | * | 4/1997 | Bezama et al. | 438/601 |
| 5,976,943 A | * | 11/1999 | Manley et al. | 438/382 |
| 6,566,730 B1 | * | 5/2003 | Giust et al. | 257/529 |

* cited by examiner

Primary Examiner—David Nelms
Assistant Examiner—Dao H. Nguyen
(74) Attorney, Agent, or Firm—John R. Ley, LLC

(57) ABSTRACT

A severable horizontal portion of a fuse link is formed relative to a vertically configured structure in an IC to promote separation of the severable portion upon applying energy from a laser beam. The vertically configured structure may be a reduced vertical thickness of the severable portion, an elevated lower surface of the severable portion above adjoining portions of the fuse link, a protrusion which supports the severable portion at a height greater than a height of the adjoining portions of the fuse link, flowing the melted severable portion down sloped surfaces away from a break point, and a propellent material beneath the severable portion which explodes to ablate the severable portion.

13 Claims, 6 Drawing Sheets

LASER-BREAKABLE FUSE LINK WITH ALIGNMENT AND BREAK POINT PROMOTION STRUCTURES

CROSS-REFERENCE TO RELATED INVENTIONS

This invention is a division of U.S. application Ser. No. 09/723,476 filed Nov. 27, 2000, now U.S. Pat. No. 6,566,730, filed by the inventors herein.

FIELD OF THE INVENTION

The present invention relates to fuse links used in semiconductor integrated circuits (ICs). More particularly, the present invention relates to a new and improved horizontally extending fuse link and method of fabricating it which includes a vertically configured break point structure that promotes severing the fuse link structure by a laser beam under circumstances which require less precise alignment and less energy, and which promotes a cleaner break with less likelihood of the melted fuse link reconnecting, among other things.

BACKGROUND OF THE INVENTION

As IC chips continue to decrease in size and increase in complexity, there is an increasing likelihood of fabricating a defective chip as a result of a failed element or a defective conductor. One way to reduce the number of defective chips which must be scrapped due to fabrication defects is to build selectively programmable fuse links into the IC. The fuse links may be blown, opened or severed to isolate defective semiconductor structures on the IC, and to insert properly functioning circuitry in place of the defective circuitry. As a result, the faulty IC is repaired and becomes useable. The yield or number of properly functioning IC chips obtained from the fabrication process is increased. Using selectively-severable fuse links reduce the number of IC chips which must be scrapped due to defects. Such fuse links are also be used for other purposes on a properly functioning IC, such as trimming circuitry or enabling a particular functional mode of the IC.

Fuse links are frequently used in conjunction with redundant memory cells of memory ICs or embedded memory segments in application specific integrated circuits (ASICs) or system level integrated circuits (SLICs). If a memory cell is defective, a redundant memory cell is substituted and the defective memory cell is disconnected. It is not unusual for IC memory chips or memory segments of ASICs or SLICs to be formed by hundreds of thousands or millions of such memory cells. With such a large number of memory cells, there is a significant risk that at least some of those memory cells will be defective when fabricated. Using breakable fuse links is particularly important in more complex ICs, such as ASICs and SLICs, which have a relatively high proportion of functional circuitry compared to memory. Having to discard or scrap the entire ASIC or SLIC because of a defect in a few memory cells can have enormous financial implications regarding the cost of manufacturing the ASICs or SLICs. Using programmable fuse link structures in memory segments of ASICs or SLICs, as well as in other parts of the IC, increases economic efficiency in IC fabrication by substantially raising the yield of functional circuits produced from the fabrication process.

The typical method of blowing, severing or opening a conventional fuse link involves focusing a laser beam on a fuse structure formed in the IC. The energy density and pulse duration of the laser beam deliver sufficient energy to the fuse link to vaporize or melt the fuse material, thereby severing or opening the pre-existing electrical path through the fuse link. Once the electrical path has been opened, current can no longer flow through it. The circuitry of the IC has been designed to respond to this open circuit by disconnecting defective circuit elements and inserting correctly functioning circuit elements. Recent ICs include multiple layers of the electrical conductors overlying a substrate upon which the functional logic and memory devices are formed. Each of these layers of electrical conductors is referred to as an interconnect layer. In modern ICs, as many as six interconnect layers may be formed on top of the substrate. By routing most of the electrical signal paths through the interconnect layers, more of the area of the substrate is available for forming functional logic and memory devices to achieve greater functionality from smaller IC chips. Since the logic and memory devices are overlaid by metal layers, the breakable fuse links are positioned in an upper interconnect layer so that they may be irradiated by the laser beam.

The fuse links are formed of metals or metal alloys, for example, aluminum-copper (Al—Cu), the same as the metals used in the conductors of the interconnect layers. Other types of conventional breakable fuse links are formed from polysilicon, although polysilicon fuse links are typically formed on the substrate of an IC and not as a part of the interconnect layer. The polysilicon fuse links more efficiently absorb laser energy, allowing lesser energy laser beams to blow polysilicon fuse links. However, metal does not absorb laser energy as efficiently as polysilicon, so the amount of energy delivered by a laser beam to blow a metal fuse link must be increased. The increased laser energy risks the possibility of thermal damage to adjoining circuitry of the IC. Consequently, it is desirable to reduce the amount of energy delivered to the IC by the laser beam to that minimum amount which is effective in blowing the fuse link.

A number of other factors also influence the amount of energy delivered by the laser beam to the fuse link. The ability to precisely position the location of the laser beam is important, because a directly positioned laser beam will be more effective in melting the fuse link. If the laser beam is slightly misaligned, some of the energy density or fluence from the laser beam will be transferred to adjoining elements of the IC and will not be effective in melting the fuse link. Another consideration is that the smallest spot or diameter of a laser beam is presently limited to approximately 2.5 micrometers. In most cases, the width of the conductors used in most modern ICs is smaller than 2.5 micrometers. Therefore there will be some inherent overlap of the laser beam spot with adjoining circuitry. The spacing or "pitch" to adjoining circuitry, typically another fuse link, is thereby defined by the spot size of the laser beam and the ability to precisely position laser beam. A misaligned laser beam, a large laser beam, or a pitch between adjoining laser links which causes the laser beam to overlap and possibly melt adjoining links will not be effective or desirable. Finally, a high-throughput fuse-blowing process is desired in order to increase the manufacturing efficiency. Because these and other constraints can conflict in implementing an effective fuse-blowing process, several prior art techniques have been developed to enhance the fuse blowing process.

Antireflective coatings have been applied to the surface of the IC to confine the energy from the laser beam to the fuse link, rather than reflecting some of the energy to adjoining circuitry. By confining the laser beam energy to the desired fuse link, more of the energy is available to melt the fuse link.

The break point at which the fuse link is severed by a laser beam, has configured photolithographically during the fabrication of the IC to promote absorption of the laser beam energy. The configuration of the fuse link attracts energy from the laser beam and becomes somewhat self-aligning to melt the fuse link. The energy attracting configuration of the fuse link compensates for slight misalignments in the position of the laser beam spot. The self-aligning fuse link configuration also makes the fuse break point less sensitive to the laser beam power. Photolithographic constraints on the fuse link also permit the pitch between adjoining fuses to be reduced to, thereby increasing the density of functional components on the IC chip. Because the laser alignment is less critical, less time is consumed in positioning the laser beam which increases the chip processing throughput.

One type of self aligning fuse link configuration increases the width of the material at the fuse link, under the theory that the increased amount of fuse material will absorb more of the energy from the laser beam and thereby more readily melt the fuse link. Another configuration, which follows the opposite theory, is to reduce the size of the material at the fuse link. The reduced amount of material will require less thermal energy to melt that material and blow the fuse link. In both cases, the configuration of the fuse link is photolithographically patterned using conventional semiconductor fabrication techniques. In both cases, the configuration is executed in the horizontal plane of the conductors and fuse links, such as by necking down a conductor at a narrow area of the fuse link or by expanding the conductor at a broad area of the fuse link.

However, one common problem to both types of self-aligning techniques is that there is some possibility that the melted residual material of the fuse link will flow back together immediately after it has been melted, and thereby form a bridge between the adjoining non-melted conductors. Such a bridge reestablishes the electrical connection and does not result in a blown or severed fuse link. If the fuse link remains conductive, the remedial process will have failed and the IC chip will have to be discarded.

All of these and other considerations relating to breakable fuse links of ICs have given rise to the present invention.

SUMMARY OF THE INVENTION

The present invention is for a self-aligning fuse link structure which is formed using conventional semiconductor fabrication techniques and which promotes blowing the fuse link more effectively and completely, while diminishing the risks that the melted fuse link material will inadvertently bridge the blown link and reestablish an electrical connection. The present invention is also for a method of blowing a fuse link without requiring melting of the fuse link material itself. These features of the present invention are accomplished while avoiding thermal damage to adjoining circuitry, reducing or minimizing the amount of laser energy applied, and permitting some degree of misalignment of the laser beam relative to the fuse link, among other things.

To achieve these and other improvements and aspects, the present invention is a fuse link which includes a severable portion which is severed from energy applied from a laser beam. The severable portion generally extends not only horizontally also has a predetermined vertically configured structure within the IC which promotes separation of the severable portion at a break point. In one embodiment, the predetermined vertically configured structure comprises a reduced vertical thickness of the severable portion. In another embodiment, the predetermined vertically configured structure comprises a protrusion over which the severable portion extends, the protrusion extends vertically upward to a height greater than a height of adjoining portions of the fuse link. In another embodiment, the predetermined vertically configured structure comprises a pocket of propellent material located vertically beneath the severable portion of the fuse link. The propellent material explodes upon melting from energy imparted by the laser beam to break the severable portion. The propellent material characteristically melts at a temperature less than the temperature at which the severable portion melts and at a temperature greater than the temperature at which this material in the IC is subjected during fabrication.

These and other improvements are also achieved by a method of fabricating a fuse link extending generally horizontally in the IC. The method comprises the steps of forming a horizontally extending fuse link with a severable portion to be severed at a break point from energy applied from a laser beam, forming a predetermined vertically configured structure in the IC which promotes separation of the severable portion, and extending the severable portion over the vertically configured structure. The vertically configured structure may be formed by reducing a vertical thickness of the severable portion at the break point, elevating a lower surface of the severable portion above a lowermost surface of adjoining portions at the break point, forming a protrusion extending vertically upward to a height greater than a height of adjoining portions of the fuse link, melting the severable portion at the break point and flowing melted material from the severable portion down sloped surfaces away from the break point, and exploding a propellent material beneath the severable portion at the break point to ablate the severable portion by pressure from gas effusing from the melted propellent material.

The predetermined vertically oriented structure has a self-aligning aspect which promotes severing the fuse link from low fluence energy laser beams and slightly misaligned laser beams. Moreover, the predetermined vertically oriented structure may be formed using conventional semiconductor photolithographic fabrication techniques which define the area to be blown independently of the position and alignment of the laser beam. The vertically oriented structure promotes blowing the fuse link more effectively and completely, without increasing the risks of the melted fuse link material inadvertently bridging the blown link and reestablishing an electrical connection through the fuse link. The use of the propellent material permits the severable portion of the fuse link to be blown without reaching temperatures high enough to melt the fuse link itself. The reduced thermal energy from the laser beam diminishes the risk of damaging adjoining circuitry or causing unwanted dopant diffusion into the other semiconductor structures of the IC.

A more complete appreciation of the present invention and its scope may be obtained from the accompanying drawings, which are briefly summarized below, from the following detailed descriptions of presently preferred embodiments of the invention, and from the appended claims.

DETAILED DESCRIPTION

Figure 1:
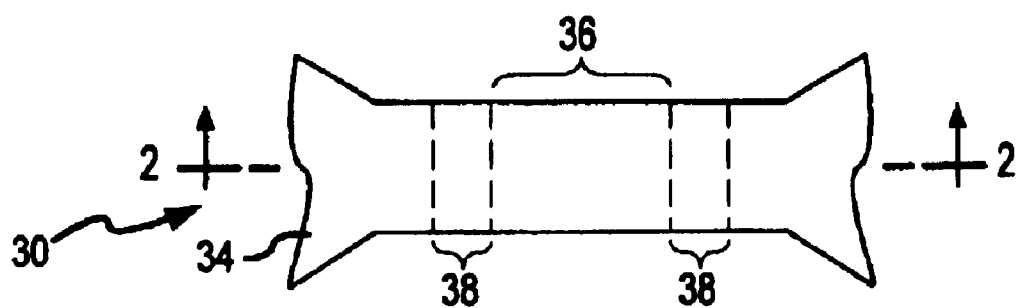
FIG. 1 is a top plan view of a portion of an integrated circuit illustrating one embodiment of a laser-breakable fuse link incorporating the present invention.
Figure 2:
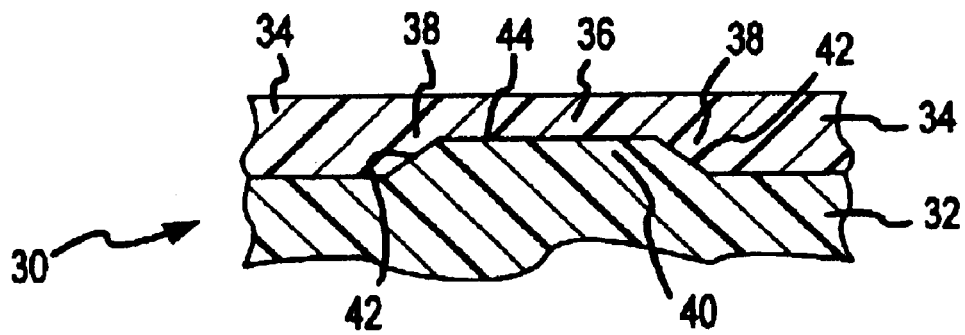
FIG. 2 is a side sectional view taken substantially in the plane of line 2—2 of FIG. 1.
Figure 3:
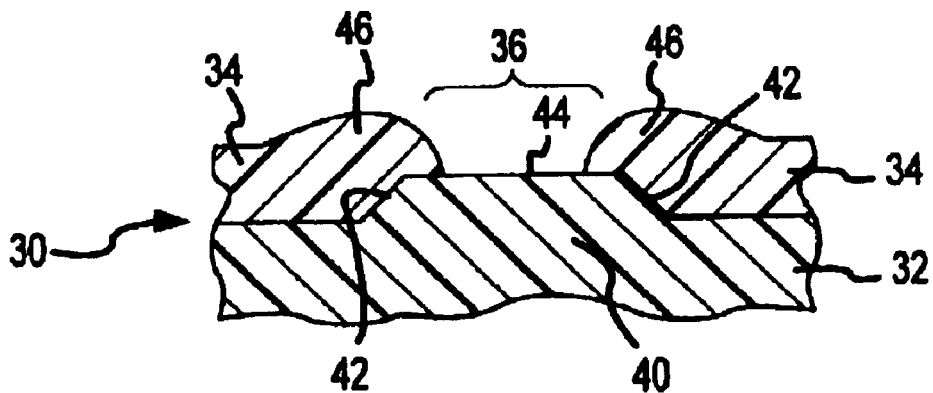
FIG. 3 is a view similar to FIG. 2, illustrating the fuse link shown in FIG. 1 in a severed condition.

One embodiment of a laser-breakable fuse link 30 which incorporates the present invention is shown in FIGS. 1–3. The fuse link 30 is preferably formed by metal, although the fuse link 30 could also be formed of other materials. The fuse link 30 is formed on top of a dielectric material 32, and is connected to or formed as part of adjoining conductors, portions of which are shown at 34. The conductors 34 and fuse link 30 may be part of an interconnector layer, and if so, are positioned on the upper surface of an IC (not specifically shown). In another case, the conductors 34 and fuse link 30 may be formed on a layer of dielectric material 32 which is connected to a substrate (not shown) of the IC. Although not shown in FIGS. 1–3, an optimum thickness of passivation oxide may be formed above the fuse link 30 to promote laser cutting.

The fuse link 30 includes a portion 36 which has a lesser thickness than adjoining transition portions 38 of the fuse link and the conductors 34. The reduced thickness of the portion 36 is illustrated by the lesser vertical dimension of that portion 36 as shown in FIG. 2 compared to the vertical dimension of the conductors 34. The lesser of thickness portion 36 is the portion of the fuse link 30 that will be blown or melted as shown in FIG. 3. Because the laser fluence or power required to melt a material is proportional to the thickness of this material, the thinned portion 36 of the fuse link 30 will blow at a lower laser fluence compared to a full-thickness fuse link. A full thickness fuse link would have the same thickness as the adjoining conductor 34. Since the thinner portion 36 can be blown with less laser energy, the exposure to the IC substrate and adjoining circuitry of the IC (not shown) is reduced. The reduced thermal exposure prevents unwanted dopant diffusion and/or laser-induced damage in the material below the fuse link 30. In the fuse link 30, the thinned portion 36 is a vertically oriented structure which promotes separation of the severable portion 36.

The length of the thinned portion 36, in the right and left dimension as shown, is selected so that the spot encompassed by the laser beam diameter falls completely on the thinned portion 36, or the thinned portion 36 falls completely within the laser beam spot diameter. The advantage of the latter case is that the length of the fuse link 30 may be reduced, since only the thinned portion 36 will blow. Also, the thinned portion 36 which will be blown is defined in a predetermined location using lithography and other conventional semiconductor fabrication techniques, instead of relying entirely on optical-based laser-alignment targeting and positioning which is inherently less accurate. Consequently, a larger window exists for laser misalignments. If the laser is misaligned, the laser fluence can be increased to blow the fuse link 30, while still retaining a relatively lower fluence than would be required to blow the fuse link if it had been a full thickness. The width of the thinned portion 36 can also be optimized to increase optical absorption and promote cutting.

The thinned portion 36 of the fuse link 30 is reduced from the bottom-up, as shown in FIG. 2. The transition portions 38 of the fuse link 30 extend between the thinned portion 36 and the full thickness conductors 34. An upward protrusion 40 of dielectric material 32 extends above the lower level of the conductors 34. The upward protrusion 40 includes two downward and outward sloping surfaces 42 upon which the transition portions 38 rest. An upper surface 44 of the protrusion 40 supports the thinned portion 36 of the fuse link 30 at a level higher than the lower surface of the transition portions 36 and the conductor portions 34. The two downward and outward sloping surfaces 44 tend to drain or flow the liquid melted fuse link material outward and away from the break point. As a result, the melted fuse link material tends to form puddles 46 which solidify on opposite sides of the break in the fuse link as shown in FIG. 3. By flowing outward into the puddles 46 and away from the break point of the thinned portion 36 and because there is less material in the thinned portion 36 to melt, there is less likelihood that an inadvertent bridge of fuse material will reform as a result of the melted fuse material flowing back together.

The width of the transition portions 38 of the fuse link 30 adjacent to the thinned portion 36 is preferably optimized to prevent melting of the entire transition portions 38 but to permit some melting and thereby facilitate forming the puddles 46. The thickness of an oxide coating (not shown) covering the fuse link 30 over both the thinned portion 36 and the transition portions 38 is also preferably optimized using known optical-interference concepts to enhance optical absorption in the thinner portion 36, while reflecting the incident laser energy in the thicker transition portions 38 and on the conductor portions 34. Such coating techniques also promote the thinner portion 36 blowing before the thicker transition portions 38 and the conductor portions 34.

The fuse link 30 shown in FIGS. 1–3 may be formed by conventional semiconductor fabrication techniques. For example, the protrusion 40 of dielectric material 34 may be deposited on top of an existing upper surface of dielectric material 32, and the sloping surfaces 42 of the dielectric material may be formed by either an isotropic or an anisotropic etch applied to the deposited material to change the vertical corners of the deposited material to the downward and outward sloping surfaces. Thereafter the metal forming the fuse link 30 is formed on top of the protrusion 40 in the same step during which the metal layer for the conductors 34 of the interconnector layer (not shown) are formed. Those portions of the metal layer which protrude above the upper surface of the conductors 34 may thereafter be reduced into a horizontal co-planar surface as shown in FIGS. 1–3 by conventional planarization techniques such as chemical mechanical polishing (CMP).

Figure 4:
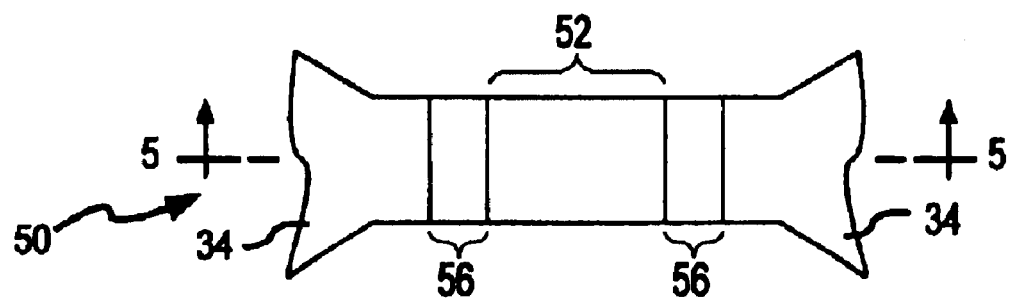
FIG. 4 is a top plan view of a portion of an integrated circuit illustrating another embodiment of a laser-breakable fuse link incorporating the present invention.
Figure 5:
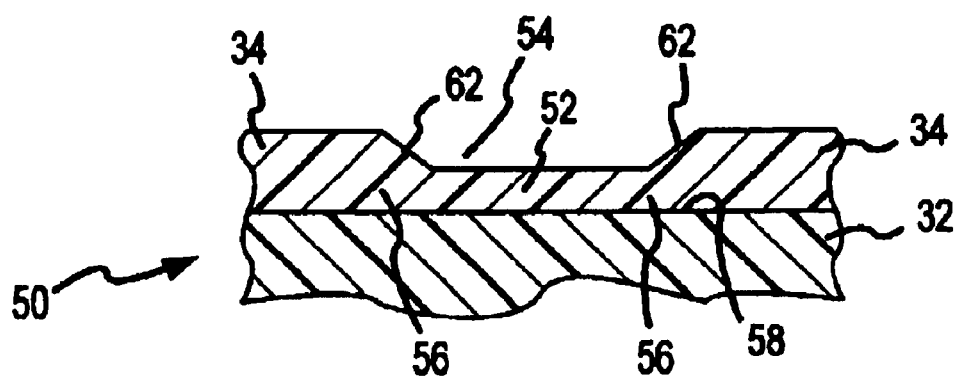
FIG. 5 is a side sectional view taken substantially in the plane of line 5—5 of FIG. 4.
Figure 6:
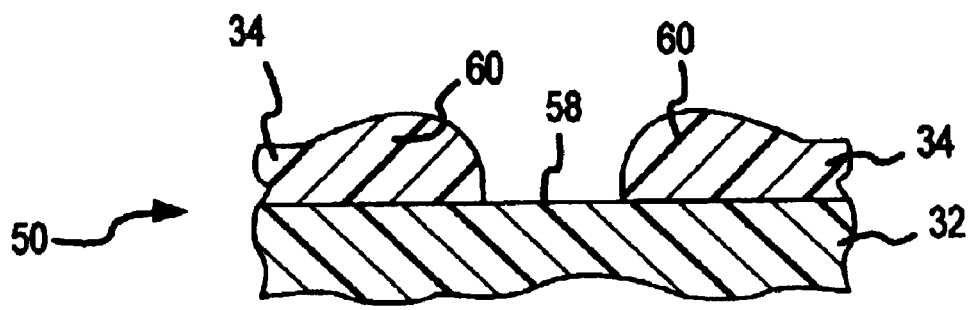
FIG. 6 is a view similar to FIG. 5, illustrating the fuse link shown in FIG. 4 in a severed condition.

Another embodiment of the present invention, which is an alternative to the fuse link 30 shown in FIGS. 1–3, is a fuse link 50 shown in FIGS. 4–6. In the fuse link 50, a thinned portion 52 is formed by forming a trough 54 into an upper surface of the full thickness fuse link 50, as shown in FIG. 5. Transition portions 56 extend between the thinned portion 52 and the full thickness conductor portions 34. The conductors 34 and the fuse link 50 rest on an upper planar surface 58 of the dielectric material 32. When the laser beam is focused on the thinned portion 52, it will melt, and the melted liquid metal will tend to accumulate in puddles 60 at opposite ends of the break in the fuse link 50 adjacent to the transition portions 56, as shown in FIG. 6.

Although the fuse link embodiment 50 shown in FIGS. 4–6 does not include a structural component which tends to move the molten fuse link material to the outside of the break, as does the fuse link embodiment to 30 shown in FIGS. 1–3, the thinned portion 52 constitutes less material which needs to be melted and vaporized. The lesser material resulting from the thinned portion 52 reduces the possibility of an inadvertent bridge being formed. Moreover by optimizing the transition portions 56 in width and thickness, the downward and inward sloping surfaces 62 provide a volume for accumulating the puddles 60 of molten metal, and allow the surface tension to maintain the coherency of the puddle without forming inadvertent bridges. The thinned portion 52 has a vertical configuration in the form of reduced thickness which promotes separation at the severable thinned portion 52.

The thinner portion 52 may be formed as a result of forming the trough 54 into full thickness material. The trough 54 may be formed by conventional photolithographic patterning and etching techniques, involving etching the trough 54 into the metal of the fuse link 50. The etching can be timed to reduce the thickness of the thinned portion 52 to the desired amount, or the etching can be stopped at the bottom surface of the trench 54 by using conventional etch stop techniques. The sloping surfaces 62 are formed as a result of conventional isotropic or anisotropic etching which reduces square corners into sloped surfaces.

Figure 7:
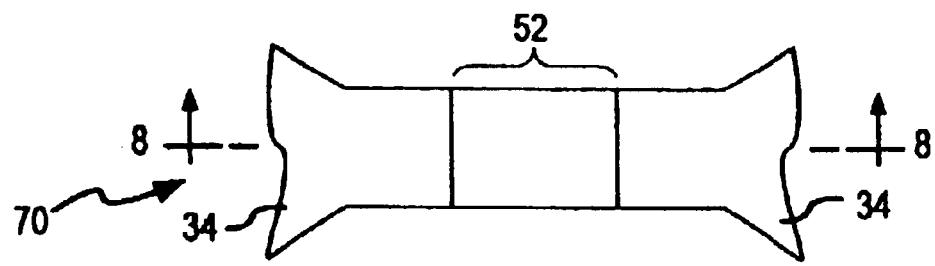
FIG. 7 is a top plan view of a portion of an integrated circuit illustrating another embodiment of a laser-breakable fuse link incorporating the present invention.
Figure 8:
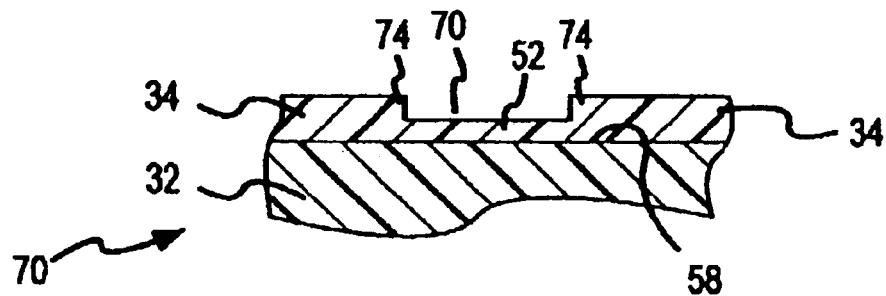
FIG. 8 is a side sectional view taken substantially in the plane of line 8—8 of FIG. 7.

A fuse link 70 shown in FIGS. 7 and 8 is an alternative to the fuse link 50 shown in FIGS. 4–6. In the fuse link 70 shown in FIGS. 7 and 8, the thinned portion 52 is formed by a trough 72 which has square corners 74. Because of the square corners, there is no comparable portion to the transition portions 56 of the fuse link 50 shown in FIGS. 4–6. Consequently, the square corners 70 do not provide additional volume for the melted fuse link material to accumulate at the opposite sides of the break in the fuse link, as do the sloping surfaces 62 of the fuse link 50 shown in FIGS. 4–6. Nevertheless, the surface tension of the melted fuse link material and the length of the thinned portion 52 of the fuse link 70 are sufficient to prevent bridging of the melted material between the separated conductors 34 after the laser beam melts the thinned portion 52.

The trough 72 used to form the thinned portion 54 of the fuse link 70 is formed by conventional photolithographic patterning and etching techniques used in semiconductor fabrication. However, conventional etching is used to form the trough 72 with square corners 74.

Figure 9:
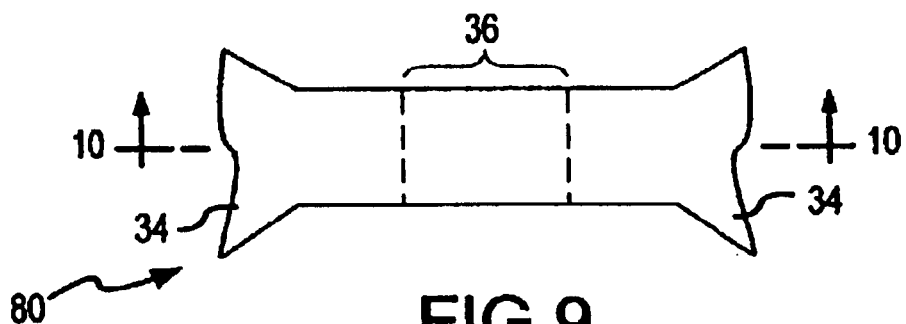
FIG. 9 is a top plan view of a portion of an integrated circuit illustrating another embodiment of a laser-breakable fuse link incorporating the present invention.
Figure 10:
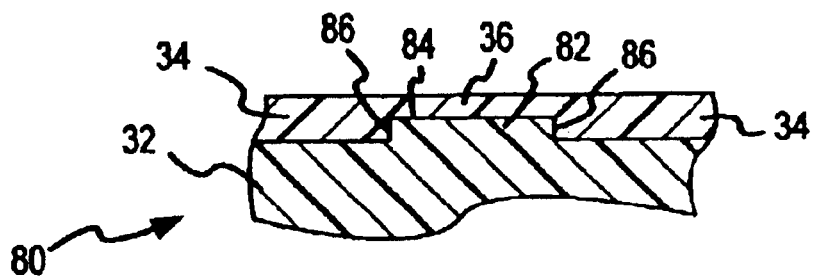
FIG. 10 is a side sectional view taken substantially in the plane of line 10—10 of FIG. 9.

A fuse link 80 shown in FIGS. 9 and 10 is an alternative to the fuse link 30 shown in FIGS. 1–3. The fuse link 80 shown in FIGS. 7 and 8 has the thinned portion 36 positioned on top of a square-cornered protrusion 82 extending upward from the dielectric material 32. The thinned portion 36 rests on top of an upper surface 84 of the protrusion 82. In the fuse link 80, there is no comparable portion to the transition portions 38 of the fuse link 30 shown in FIGS. 1–3. Therefore, there is no additional volume for the melted fuse link material to accumulate at the opposite sides of the break in the fuse link. However, because the upper surface 84 of the protrusion 82 extends above the lower surface of the conductors 34, there is still a tendency for the melted fuse link material to pull away from the break by surface tension and accumulate at the laterally opposite sides of the protrusion 82. The accumulation at opposite ends of the protrusion 82, the surface tension of the melted fuse link material, the length of the thinned portion 36, and the reduced amount of material in the thinned portion 36 of the fuse link 30 are sufficient to prevent bridging of the melted material between the separated conductors 34 after the laser beam melts the thinned portion 36.

The protrusion 82 used to form the thinned portion 36 of the fuse link 30 is formed by conventional photolithographic patterning techniques used in semiconductor fabrication. Preferably the material forming the protrusion 82 is deposited onto an upper planar surface of the dielectric material before the metal forming the conductors 34 and thus the thinned portion 36 are deposited on top of the protrusion 82. Conventional deposition techniques allow the square corners 86 to be formed.

Forming the square corners 74 and 84 in the fuse links 70 and 80, respectively, simplifies the fabrication of the fuse links and allows conventional etch and deposition techniques to be used. A separate etch step is not necessary to form the sloping surfaces 42 of the protrusion 40 of the fuse link 30 (FIGS. 1–3) or to form the sloped surfaces 62 of the trough 54 (FIG. 5).

Figure 11:
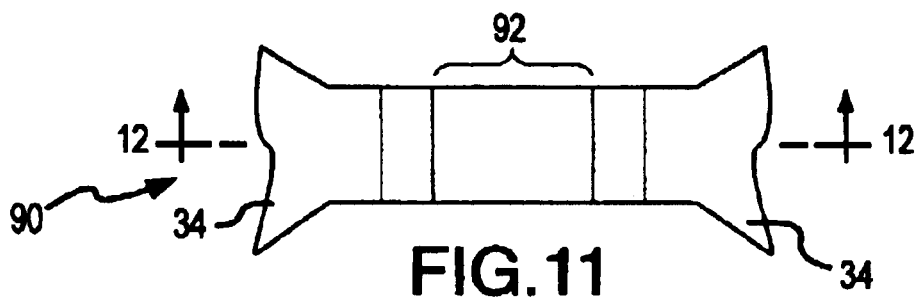
FIG. 11 is a top plan view of a portion of an integrated circuit illustrating another embodiment of a laser-breakable fuse link incorporating the present invention.
Figure 12:
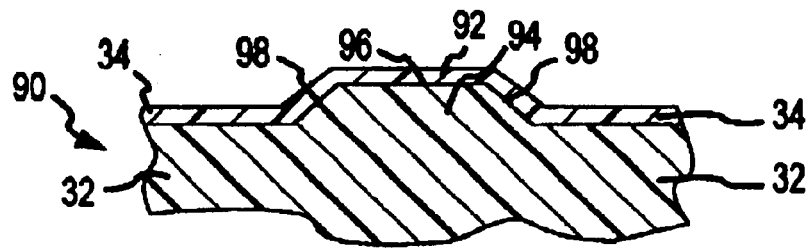
FIG. 12 is a side sectional view taken substantially in the plane of line 12—12 of FIG. 11.
Figure 13:
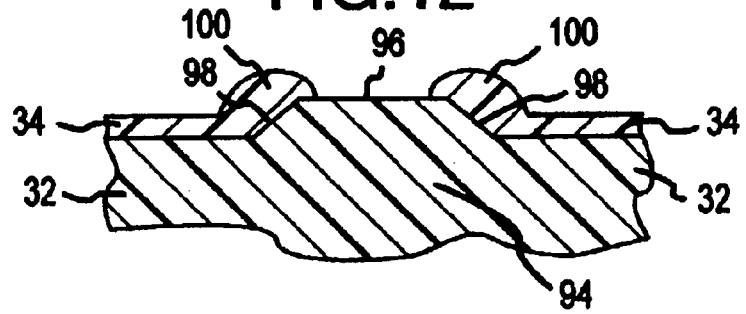
FIG. 13 is a view similar to FIG. 12, illustrating the fuse link shown in FIG. 11 in a severed condition.

Many of the advantages and improvements of the fuse link embodiments 30, 50, 70 and 80 shown in FIGS. 1–10 may be obtained from another fuse link 90 of the present invention which is shown in FIGS. 11–13. In the fuse link 90, a meltable portion 92 of the fuse link 90 is positioned at a height or level which is even with or above the upper surface of the adjoining conductors 34. The meltable portion 92 may have the same thickness as the conductor portions 34, or the meltable portion 92 may be thinner than the adjacent conductor portions 34 in the same manner as shown in the above embodiments 30, 50, 70 and 80. The meltable portion 92 extends over a protrusion 94 of dielectric material 32. An upper surface 96 of the protrusion 94 is located above the lower surface of the adjoining conductors 34. Sides 98 of the protrusion 94 slope downwardly and outwardly away from the meltable portion 92 where the fuse link is severed.

By placing the meltable portion 92 at a level higher than the adjoining portions of the fuse link, the melted link material is encouraged to flow down and away from the blown-area and form puddles 100 at opposite sides of the protrusion 94, as shown in FIG. 13. The downward and outward sloping surfaces 100 draw the melted fuse link material away from the breakpoint and expose the upper surface 96. By drawing the melted material away from the upper surface 96, and providing a lower volume in which the melted fuse material may accumulate in the puddles 100, the inadvertent creation of bridges from the severed fuse link is avoided. The protrusion becomes a vertically configured structure which promotes the separation of the severable meltable portion 92. All of the advantages described in connection with the embodiments 30, 50, 70 and 80 are also achieved by the fuse link 90. In the fuse link 90, it is not necessary to perform additional semiconductor fabrication processes to reduce the thickness of the meltable portion 92, as is required to produce the thinner portions 36 and 56 as shown in the embodiments 30, 50, 70 and 80.

Figure 14:
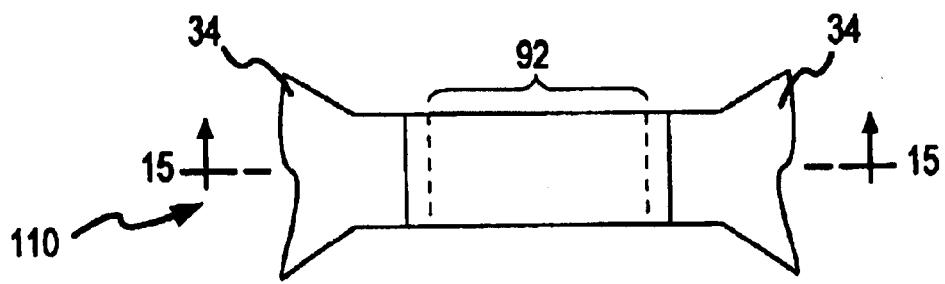
FIG. 14 is a top plan view of a portion of an integrated circuit illustrating another embodiment of a laser-breakable fuse link incorporating the present invention.
Figure 15:
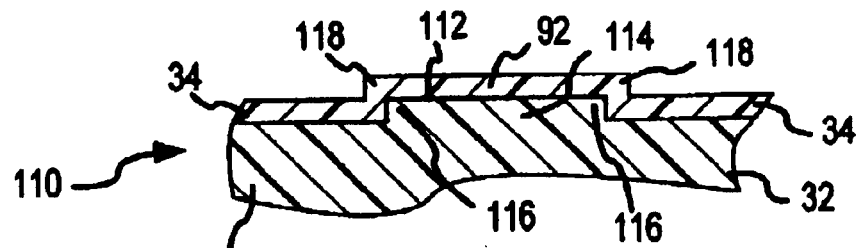
FIG. 15 is a side sectional view taken substantially in the plane of line 15—15 of FIG. 14.

An alternative to the fuse link embodiment 90 shown in FIGS. 11–13, is the fuse link 110 shown in FIGS. 14 and 15. In the fuse link 110, the meltable portion 92 also rests on an upper surface 112 of a protrusion 114. However the protrusion 114 has square corners 116 rather than the sloped surfaces 98 in the fuse link 90 shown in FIGS. 1–13. The meltable portion 92 rests on the upper surface 112 and is therefore elevated with respect to the lower surface of the adjoining conductors 34. Upon melting the material from the meltable portion 92 withdraws and pull away from the break point by surface tension and accumulates at the laterally opposite sides of the protrusion 112. The accumulation at opposite ends of the protrusion 112, the elevation of the protrusion 112 relative to the adjoining conductors 34, the surface tension of the melted fuse link material and the length of the meltable portion 92 of the fuse link 110 are sufficient to prevent bridging of the melted material between the separated conductors 34 after the laser beam melts the meltable portion 92.

The fuse links 90 and 110 may be fabricated using the conventional photolithographic and etching techniques used in fabricating semiconductors, as has been described previously in conjunction with the fuse links 30, 50, 70 and 80.

Figure 16:
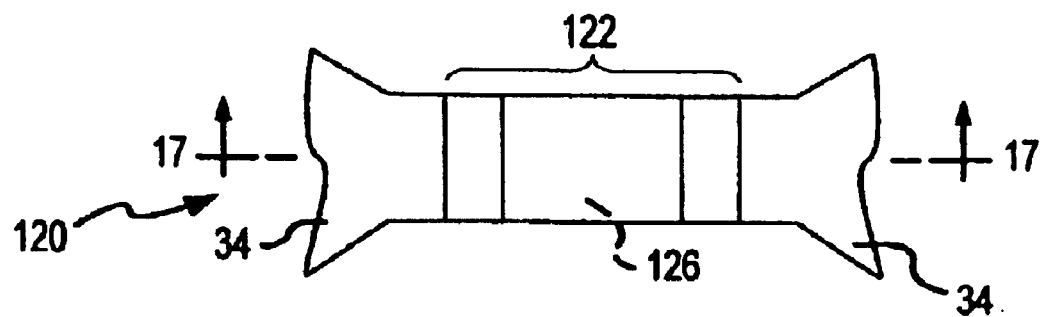
FIG. 16 is a top plan view of a portion of an integrated circuit illustrating another embodiment of a laser-breakable fuse link incorporating the present invention.
Figure 17:
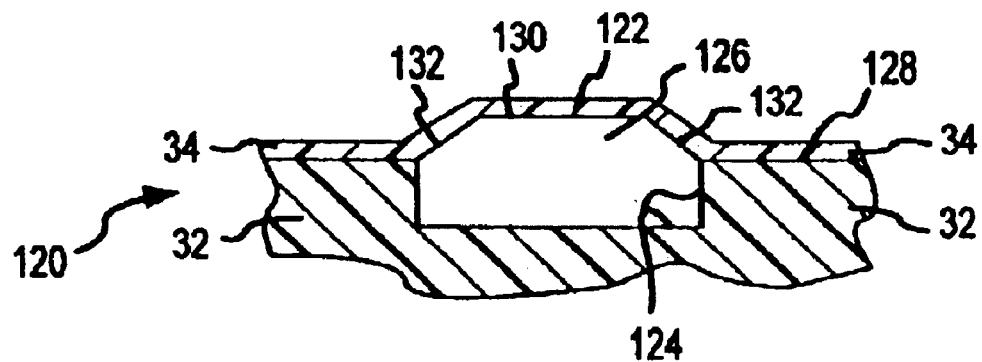
FIG. 17 is a side sectional view taken substantially in the plane of line 17—17 of FIG. 16.
Figure 18:
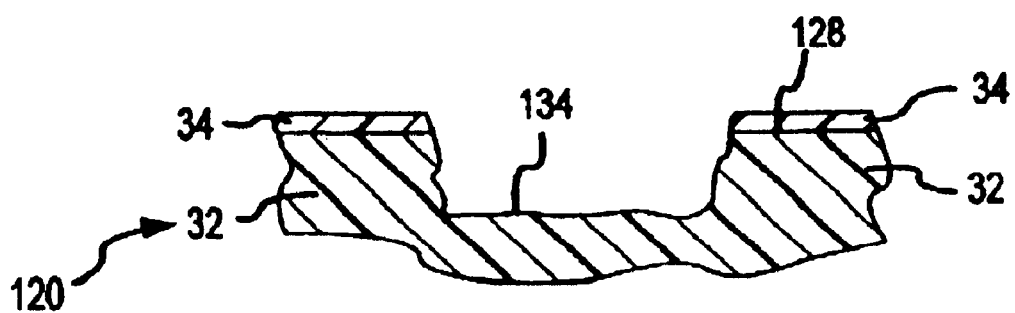
FIG. 18 is a view similar to FIG. 17, illustrating the fuse link shown in FIG. 16 in a severed condition.

A fuse link 120 which utilizes many of the advantageous and improved vertical configuration breakpoint structures described in conjunction with the embodiments 30, 50, 70, 80, 90, and 110, but may not require complete melting of the fuse link material by the laser beam, is shown in FIGS. 16–18. The fuse link 120 includes a severable or breakable portion 122 which is positioned on top of a propellent material 126 located in a pocket 124 formed in the dielectric material 32. The primary function of the propellent material 126 is to explode after being heated, by energy from an incident laser beam. The force of the exploding propellent material 126 breaks the breakable portion 122 to sever the fuse link 120, as shown in FIG. 18. The amount of energy necessary to cause the propellent material 126 to explode is less than the amount of energy necessary to melt the fuse link. Consequently, the energy or fluence from the laser beam can be reduced, and there is less risk of thermal damage to the adjoining circuitry. Because the pocket 124 of propellent material 126 is located near the top surface of the IC, the force from the explosion lifts and ablates the breakable portion 122 in an upward direction. The lesser resistance from the IC materials above the pocket 124 of propellent material 126 causes the explosion to occur upwardly, thereby preventing the force from the explosion from mechanically damaging the other components of the IC.

The propellent material 126 is preferably hydrogenated amorphous-silicon (a-SI:H). Hydrogenated amorphous silicon contains a sufficient concentration of hydrogen (typically, approximately 10% in as-deposited plasma enhanced chemical vapor deposition (PECVD) amorphous silicon) to cause atomic hydrogen gas to effuse rapidly and create explosive pressure when the propellent material is heated by exposure to the laser beam. The propellent material 126 melts under the influence of predetermined laser fluences, and melting of the propellent material 126 causes the hydrogen to effuse with explosive pressure. The explosive pressure from the effusing hydrogen totally ablates the breakable portion 122 of the fuse link 120 and thereby opens the fuse link 120, as shown in FIG. 18. The temperature required to cause the propellent material 126 to melt is less than the temperature required to melt the metal fuse link material of the breakable portion 122. Consequently, less thermal energy is required to blow the fuse link than in those circumstances where it is necessary to melt the fuse link. The propellent material 126 over which the breakable portion 122 of the fuse link 120 extends becomes a vertically oriented structure for severing the fuse link 120 at the break point of the breakable portion.

The pocket 124 is formed in the dielectric material 32, using conventional photolithographic and etching techniques. The propellant is added into the pocket 124 using conventional semiconductor deposition techniques. Because the pocket 124 is formed by the photolithographic techniques, the explosive effect is confined by the size and shape of the pocket 124. Therefore, precise alignment of the laser beam is not required, so long as sufficient laser fluence energy is delivered to the pocket 124 to cause the propellent material 126 to explode. Other types of explosive propellent material besides hydrogenated amorphous silicon may be employed.

The melting temperature of the propellent material 126 should be greater than the maximum expected temperature encountered by this material during the IC fabrication process, but less than the melting point of the breakable portion 122 of the fuse link 120. If the melting point of the propellent material 126 was greater than the melting point of the breakable portion of the fuse link, the propellent material would offer no advantage because the fuse link would melt before the propellent material exploded. On the other hand, if the melting temperature of the propellent material was reached during the semiconductor fabrication process, an explosion would occur at that point before the fuse link and the rest of the IC were fabricated. The melting point of hydrogenated amorphous silicon is approximately 1100 degrees Celsius, and the highest temperature typically encountered in the later stages of semiconductor fabrication when the propellent material and the fuse link are fabricated is considerably less, for example less than 600 degrees Celsius.

Since the breakable portion 122 of the fuse link 120 is a good electrical and thermal conductor, the temperature at the top of the link is roughly the same as the temperature at the bottom of the link just before the explosion. Since the propellent material 126 melts at a lower temperature than the link material, the propellent material can be melted to blow the link using incident laser fluences below that needed to melt the link material. This reduces the thermal exposure to the substrate, which is helpful in preventing unwanted dopant diffusions and laser-induced damage. The breakable portion 122 can also be thinned, if desired to also promote ablation by the exploding propellant material.

To encourage an upward and outward eruption of the breakable portion 122 when it is exploded, the breakable portion 122 preferably extends upwardly above an upper surface 128 of the dielectric material, as shown in FIG. 17. In this regard, the configuration of the breakable portion 122 is similar to the configuration of the fuse link 90 (FIGS. 11–13). The propellant material 126 may be deposited in the pocket 124 using conventional techniques. A top surface 130 of the deposited propellant material 120 supports the breakable portion 122 of the fuse link 120. Downward and outward sloping surfaces 132 of the deposited propellant material also support the outer edges of the breakable portion 122. The downward and outward sloping surfaces 132 may be formed by conventional etching the propellant material. The breakable portion 122 of the fuse link 120 is thereafter deposited or formed on top of the sloped surfaces 132 and the upper surface 130 of the propellant material 126. In general, the downward and outward sloping surfaces 132 promote the separation of the breakable portion 122. The force of the explosion will be perpendicular to the surfaces 130 and 132, so the explosive force is upward and outward as shown by a remaining hole 134, as shown in FIG. 18, which exists generally at the previous location of the pocket 124. Oxide or other material (not shown) may be layered on top of the fuse link 120 to confine the pressure from the exploding propellant material and cause a localized upward eruption for severing the breakable portion 122.

Figure 19:
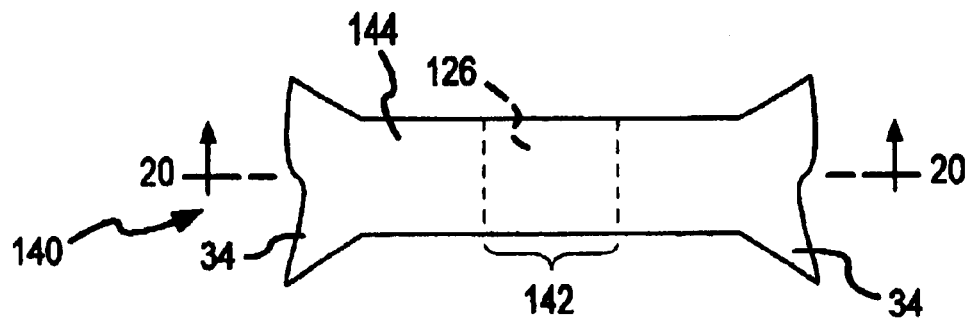
FIG. 19 is a top plan view of a portion of an integrated circuit illustrating another embodiment of a laser-breakable fuse link incorporating the present invention.
Figure 20:
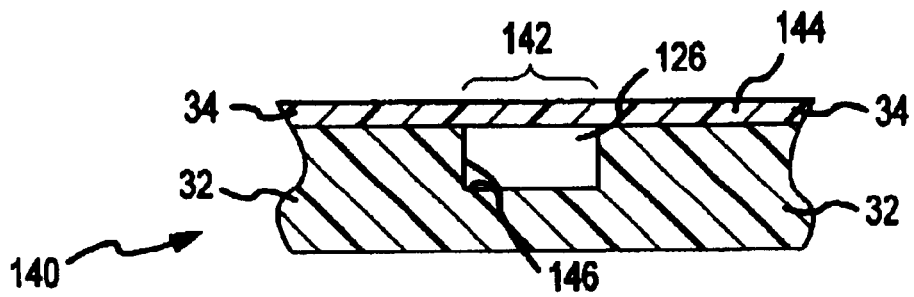
FIG. 20 is a side sectional view taken substantially in the plane of line 20—20 of FIG. 19.

Another fuse link 140 which also uses propellant material 126 to sever the fuse link is shown in FIGS. 19 and 20. A reduced length 142 of breakable material 144 is ablated or broken by the exploding propellant material 126. The propellant material 126 is localized in a relatively small pocket 146, and location of the relatively small pocket 146 is lithographically established. The length 142 of the breakable portion 144 is proportional to the length of the propellant material 126. The length 142 of the breakable portion 144 is determined lithographically by the size of the pocket 146, and is not limited by the laser beam spot diameter. The length 142 of the breakable portion 144 and the size of the pocket 144 may be smaller than the diameter of the laser spot. This allows a smaller pitch between fuse links and conserves area of the IC to permit other semiconductor devices to be fabricated in the space which would otherwise be consumed by larger structures. Also, since the location of the propellant material 126 and the breakable portion 142 is predetermined, laser alignment becomes less critical because slightly misaligned beams can be compensated for by increasing the laser fluence to blow the link. Even by increasing the laser fluence, the energy is not sufficient to melt the breakable portion of the fuse link or damage adjoining circuitry.

Figure 21:
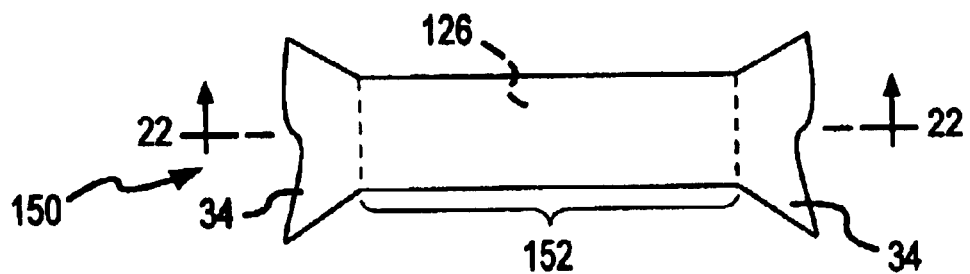
FIG. 21 is a top plan view of a portion of an integrated circuit illustrating another embodiment of a laser-breakable fuse link incorporating the present invention.
Figure 22:
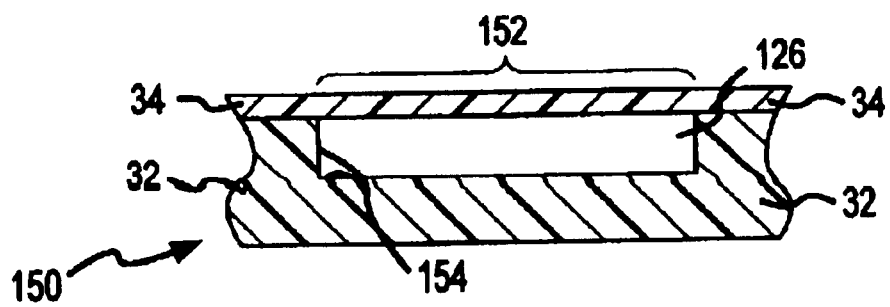
FIG. 22 is a side sectional view taken substantially in the plane of line 22—22 of FIG. 21.

Another fuse link 150 which utilizes propellant material 126 is shown in FIGS. 21 and 22. In the fuse link 150, the propellant material 126 extends substantially along the full length of a breakable portion 152 of the fuse link 150. A pocket 154 which contains the propellant material 126 extends along the entire length of the breakable portion 152. The relatively long expanse of the propellant material 126 in the fuse link 150 permits a considerable amount of misalignment of the laser beam in a left and right direction as shown in FIGS. 21 and 22. Only those limited areas of the propellant material 126 which are melted by the laser beam fluence will explode, causing the breakable portion 152 to ablate at a localized location along its relatively long length where the propellant material 126 has melted. The entire amount of propellant material 126 in the pocket 154 need not be melted or exploded in order to ablate the breakable portion 152 and sever the fuse link 150.

The fuse link embodiments 120, 140 and 150 which utilize the propellant material 126 may also exploit the well-known optical interference effects from anti-reflection oxide coatings to concentrate the energy from the laser beam. Of course the fuse links 120, 140 and 150 may also utilize some of the structural configurations of the fuse link embodiments 30, 50, 70, 80 and 90 to focus the force from the exploding propellant material in a way to achieve a more effective separation of the fuse link at the breakpoint, and to make alignment of the laser beam less critical in achieving an effective and clean separation at the breakpoint.

As can be seen from the above descriptions of the embodiments of the present invention, the vertically oriented structural configurations of the breakable and meltable portions promote outward separation and disintegration of the melted and exploded fuse link material. The meltable and breakable portions of the fuse link may be located physically higher than the adjoining thicker material, which promotes liquid and exploded material to flow away from the blown region during laser beam radiation. The use of a propellent material below the breakable portion further promotes ablation and disintegration of the fuse link. The characteristics of the meltable and breakable portions of the fuse links can be optimized by standard photolithographic semiconductor techniques, allowing the breakable and meltable portions to be smaller than the spot size of a laser beam, thereby permitting the pitch to be decreased between adjoining fuse links and achieving a higher density of devices on the IC. Similarly, the areas and circuitry adjoining the fuse links which are not desired to be influenced by the laser fluence are more readily protected because of the lower energy required from the laser beam to blow the fuse links in the above described embodiments. Optical interference effects can also be exploited with the fuse links of the present invention by using optimized dielectric film thicknesses above the fuse link to increase optical absorption in the breakable portion of the fuse link, while reducing optical absorption elsewhere in the link material. Many other advantages and improvements will be apparent upon gaining a complete understanding of the present invention.

Presently preferred embodiments of the present invention and many of their improvements and advantages have been described above with a degree of particularity. These descriptions are of presently preferred examples of implementing the invention, and are not necessarily intended to limit the scope of the invention. The scope of the invention is defined by the following claims.

What is claimed is:

1. A fuse link extending generally horizontally in an integrated circuit (IC), the fuse link including a severable portion which is severed by energy applied from a laser beam to a predetermined vertically configured structure within the IC over which the severable portion extends and which promotes separation of the severable portion at a break point, and wherein the predetermined vertically configured structure comprises a reduced vertical thickness of the severable portion.

2. A fuse link as defined in claim 1 wherein the reduced vertical thickness of the severable portion is formed by a thinned portion having a lowermost surface which is higher in elevation than adjoining portions of the fuse link.

3. A fuse link as defined in claim 2 wherein the thinned portion is supported on a protrusion extending vertically upward to a height greater than a height of the adjoining portions of the fuse link.

4. A fuse link as defined in claim 3 wherein the thinned portion is connected to the adjoining portions of the fuse link by transition portions of the fuse link, and the transition portions are supported on sloped surfaces of the protrusion.

5. A fuse link as defined in claim 4 wherein the sloped surfaces of the protrusion slope downwardly and outwardly away from the severable portion.

6. A fuse link as defined in claim 5 wherein the sloped surfaces of the protrusion promote separation of melted material from the severable portion away from the break point.

7. A fuse link as defined in claim 3 wherein the thinned portion is connected to the adjoining portions of the fuse link by vertically extending portions of the fuse link, and the vertically extending portions are adjacent to vertically extending sides of the protrusion.

8. A fuse link as defined in claim 1 wherein the reduced vertical thickness of the severable portion is formed by a thinned portion having an uppermost surface which is lower in elevation than adjoining portions of the fuse link.

9. A fuse link as defined in claim 8 wherein the thinned portion is defined by a trough formed in the severable portion between greater thickness adjoining portions of the fuse link.

10. A fuse link as defined in claim 9 wherein the thinned portion is connected to the adjoining portions of the fuse link by transition portions of the fuse link, and upper surfaces of the transition portions slope downward from the full thickness adjoining portions to the thinned portion.

11. A fuse link as defined in claim 10 wherein the upper surfaces of the transition portions slope downwardly and inwardly toward the severable portion.

12. A fuse link as defined in claim 11 wherein the sloped upper surfaces of the transition portions defined a volume for receiving melted material from the severable portion.

13. A fuse link as defined in claim 9 wherein the thinned portion is connected to the adjoining portions of the fuse link at vertically extending portions of the fuse link which extend above the severable portion.

* * * * *